(12) United States Patent
Kirby et al.

(10) Patent No.: US 8,283,785 B2
(45) Date of Patent: Oct. 9, 2012

(54) INTERCONNECT REGIONS

(75) Inventors: Kyle K. Kirby, Eagle, ID (US); Philip J. Ireland, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 228 days.

(21) Appl. No.: 12/886,199

(22) Filed: Sep. 20, 2010

(65) Prior Publication Data

US 2012/0068348 A1   Mar. 22, 2012

(51) Int. Cl.
*H01L 23/48* (2006.01)
(52) U.S. Cl. .................. 257/773; 257/775; 257/E23.01
(58) Field of Classification Search .................. 257/775, 257/E23.01

See application file for complete search history.

(56) References Cited

U.S. PATENT DOCUMENTS

| | | | |
|---|---|---|---|
| 7,005,750 B2* | 2/2006 | Liu | 257/779 |
| 7,417,245 B2 | 8/2008 | Happ et al. | |
| 7,728,319 B2 | 6/2010 | Goux et al. | |
| 7,729,162 B2 | 6/2010 | Dennison et al. | |
| 7,964,972 B2* | 6/2011 | Matsui | 257/774 |
| 7,994,044 B2* | 8/2011 | Topacio et al. | 438/612 |
| 8,202,801 B1* | 6/2012 | Lin | 438/667 |
| 2007/0272987 A1 | 11/2007 | Kang et al. | |
| 2010/0051896 A1 | 3/2010 | Park et al. | |
| 2010/0230818 A1* | 9/2010 | Birner et al. | 257/751 |
| 2011/0260329 A1* | 10/2011 | Seo | 257/774 |

OTHER PUBLICATIONS

Garrou, "PFTLE 79 Experience or Prejudice? The Case for Silicon Interposers", posted Jun. 6, 2009 on IEEE, previously published by Semiconductor International.
Khan et al., "Development of 3D Silicon Module with TSV for System in Packaging", IEEE, Electronic Components and Technology Conference, 2008.
Lau, "Evolution, Challenge, and Outlook of TSV (Through-Silicon Via) and 3D IC/Si Integration", IEEE Japan ICEP, Apr. 13-15, 2011.
Sunohara, "Development of silicon module with TSVs and global wiring (L/S=0.8/0.8um)," IEEE, Electronic Components and Technology Conference, May 26-29, 2009.
Sunohara, "Silicon Interposer with TSVs (Through Silicon Vias) and Fine Multilayer Wiring", Electronic Components and Technology Conference, May 27-30, 2008.

* cited by examiner

*Primary Examiner* — Lex Malsawma
(74) *Attorney, Agent, or Firm* — Walls St. John P.S.

(57) ABSTRACT

Some embodiments include interconnect regions. The regions may contain, along a cross section, a closed-shape interior region having an electrically conductive material therein, a first dielectric material configured as a liner extending entirely around a lateral periphery of the interior region, and at least two dielectric projections joining to the dielectric material liner and being laterally outward of the interior region. The dielectric projections may have an outer dielectric ring surrounding an inner dielectric region. The outer ring may consist of the first dielectric material and the inner dielectric region may be a composition different from a composition of the first dielectric material, and in some embodiments the composition within the inner dielectric region may be gaseous.

22 Claims, 6 Drawing Sheets

INTERCONNECT REGIONS

TECHNICAL FIELD

Interconnect regions.

BACKGROUND

Interconnect regions have numerous applications in modern integrated circuitry. For instance, interconnect regions may be utilized for electrically connecting circuitry on one side of an integrated circuit die to circuitry on the other side of the die. An integrated circuit die may be fabricated to have integrated circuitry stacked across a front side of a semiconductor material substrate (e.g., a monocrystalline silicon substrate) of the die; and may be configured with wire bonds, solder balls, etc., on a back side of the substrate for connecting the die to electrical circuitry external of the die. Through-semiconductor interconnects may be utilized for electrically connecting the circuitry on the back side of the substrate with the circuitry on the front side of the substrate.

Challenges are encountered in forming electrical isolation around through-semiconductor interconnects. Accordingly, it would be desirable to develop new approaches for providing electrical isolation around through-semiconductor interconnects.

DETAILED DESCRIPTION OF THE ILLUSTRATED EMBODIMENTS

Figure 1:
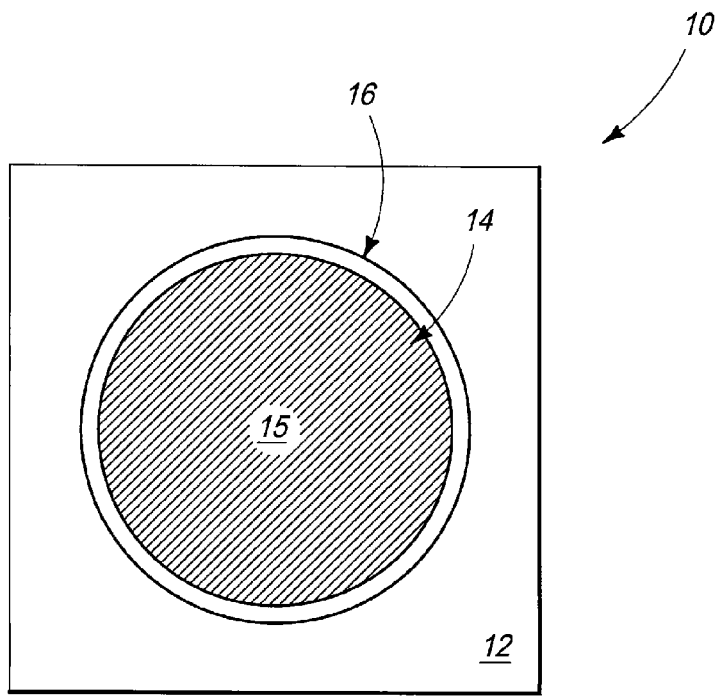
FIGS. 1 and 2 are a top cross-sectional view and a three-dimensional cut-away view, respectively, of a through-semiconductor interconnect region.
Figure 2:
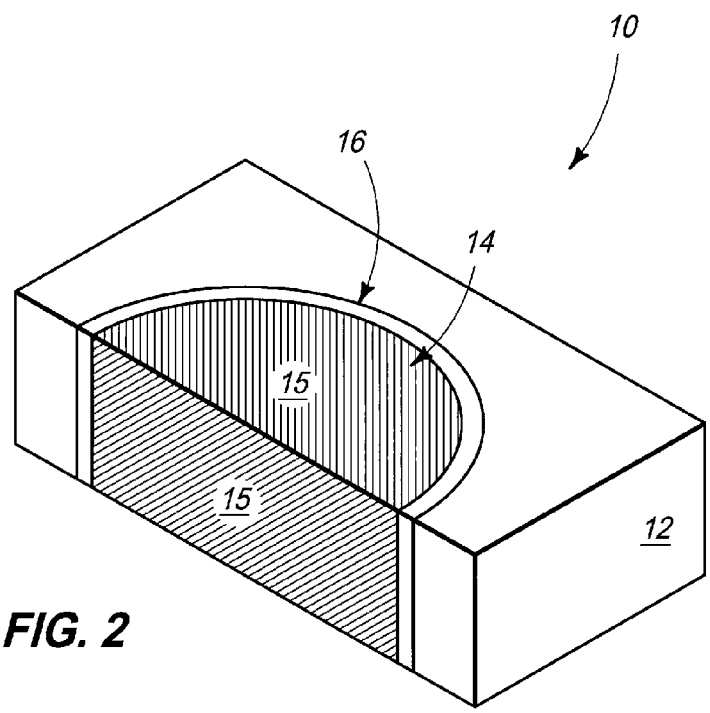

An example through-semiconductor interconnect is described with reference to a semiconductor die construction 10 in FIGS. 1 and 2. The semiconductor die construction comprises a semiconductor material substrate 12, an electrical interconnect 14 extending through the substrate, and a dielectric liner 16 extending laterally around the interconnect. The interconnect 14 is a through-semiconductor interconnect, and thus extends entirely through the semiconductor substrate to interconnect circuitry (not shown) associated with a front side of the substrate to circuitry (not shown) associated with a back side of the substrate.

Substrate 12 may comprise any suitable semiconductor material, and in some embodiments may comprise, consist essentially of, or consist of monocrystalline silicon. The substrate may support integrated circuitry (not shown), and such integrated circuitry may comprise any of various electrically conductive materials, electrically insulative materials, and semiconductor materials, arranged in desired integrated circuit architectures.

Interconnect 14 comprises electrically conductive material 15. The electrically conductive material may comprise any suitable composition or combination of compositions; and in some embodiments may comprise, consist essentially of, or consist of one or more metals (for instance, copper), metal-containing compositions (for instance, metal nitrides, metal silicides, alloys of two or more metals, etc.) and/or conductively-doped semiconductor materials (for instance, conductively-doped silicon, conductively-doped germanium, etc.). Although interconnect 14 is shown to be comprised of a homogeneous material 15, in some applications material 15 may comprise two or more discrete substances. For instance, material 15 may comprise an interior copper core laterally surrounded by titanium nitride or tantalum as copper barriers.

Dielectric liner 16 may comprise any suitable composition or combination of compositions, and in some embodiments may comprise, consist essentially of, or consist of silicon dioxide or phosphorus-doped glass.

A through-semiconductor interconnect region may be considered to comprise the electrically conductive interconnect 14 together with the dielectric liner 16. The illustrated interconnect 14 has a circular shape along the plane of the cross-section of FIG. 1, and the liner 16 conformally surrounds a lateral periphery of the interconnect 14 and thus is configured as a circular ring. The circular ring dielectric is a common configuration of the prior art. However, through-semiconductor interconnects are being packed closer together (i.e., are packed to higher densities) as integrated circuit packages are formed to increasing levels of integration. The circular ring dielectrics are becoming ineffective for desired electrical isolation of adjacent through-semiconductor interconnects at the high packing densities currently being pursued. Some of the embodiments described herein pertain to new configurations for the dielectrics surrounding through-semiconductor interconnects. In some embodiments the interconnects may extend only partially through a semiconductor substrate, rather than extend entirely through the semiconductor substrate.

Figure 3:
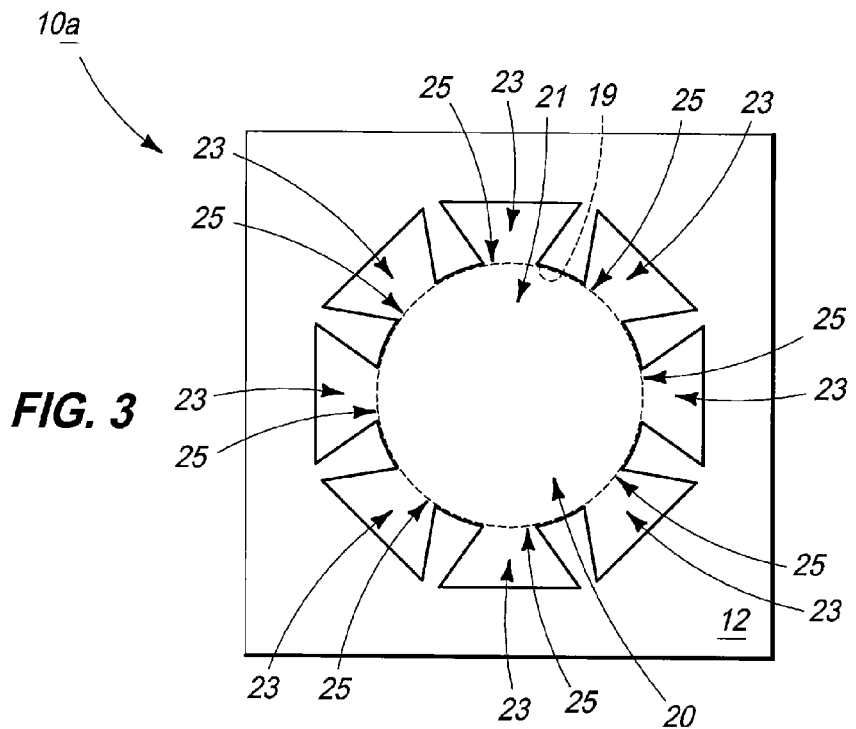
FIGS. 3-5 are top cross-sectional views of a semiconductor construction at various stages of an example embodiment process for forming an interconnect region.
Figure 4:
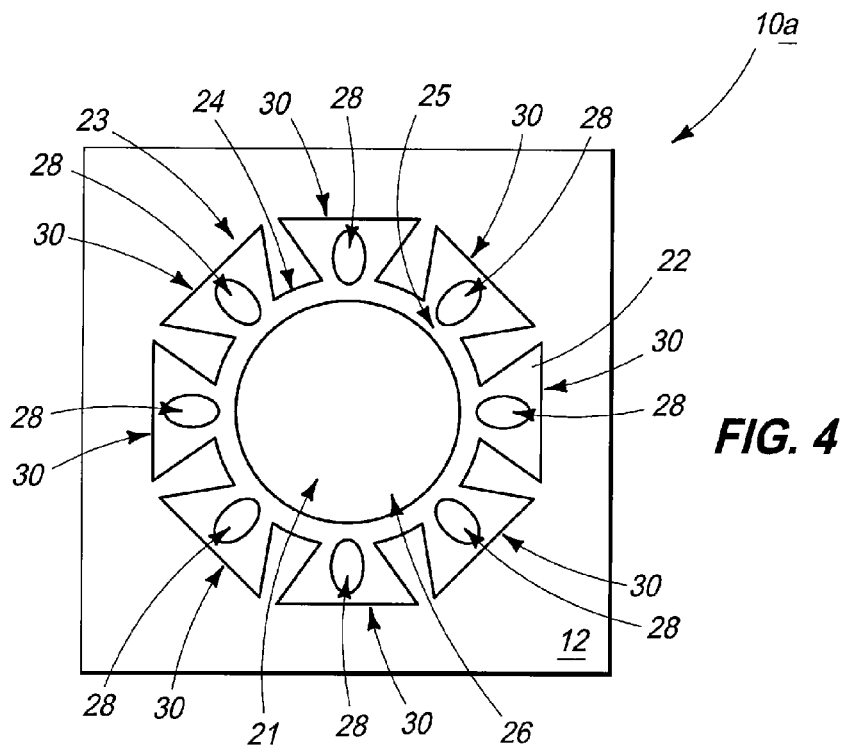
Figure 5:
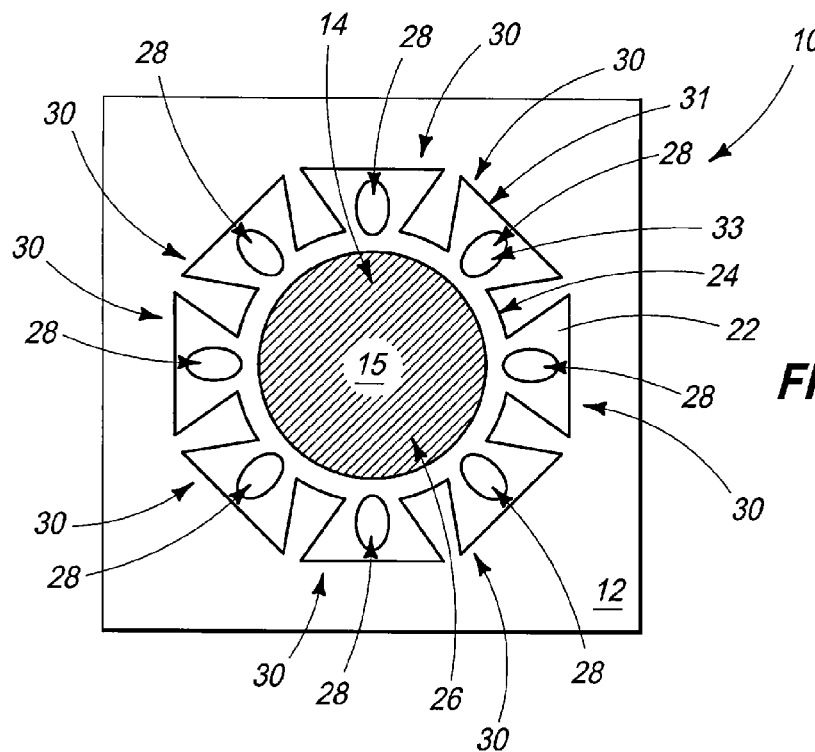

FIGS. 3-5 illustrate an example embodiment process for forming a new configuration of dielectric material around an interconnect.

Referring to FIG. 3, a semiconductor die construction 10a is shown to comprise the semiconductor material substrate 12, and to comprise an opening 20 extending through, or partially through, the substrate. Opening 20 may be formed with any suitable processing including, for example, formation of a photolithographically-patterned photoresist mask (not shown) and/or a hard mask (not shown) over substrate 12 to define the location and shape of the opening, followed by one or more suitable etches to transfer the opening through substrate 12, and subsequent removal of the one or more masks to leave the structure shown in FIG. 3. In some embodiments opening 20 may be formed with a Bosch-type process utilizing a sequence of etching and deposition; and utilizing $C_4F_8$ and/or $SF_6$ as etch gases.

Opening 20 comprises a substantially circular primary region 21, and a plurality of chambers (i.e., cavities) 23 around the primary region. A dashed line 19 is provided to diagrammatically demarcate a periphery of the substantially circular primary region 21.

In the shown embodiment the chambers 23 are substantially triangular, in that each of the chambers comprises three primary sides. Each of the triangular-shaped chambers may be considered to join with the primary region 21 of opening 20 at a vertex region 25.

Referring to FIG. 4, dielectric material 22 is provided along sidewall edges of opening 20. The dielectric material is provided to a thickness such that the material pinches off at vertex regions 25. Accordingly, a dielectric liner 24 of material 22 is formed along the periphery of primary region 21. The liner defines an opening 26 within the primary region 21, with such opening having the substantially circular shape of the primary region 21. The dielectric material 22 also laterally surrounds peripheries within the individual chambers 23 to form triangular-shaped projections 30 having voids 28 therein. In some embodiments the widths of the vertex regions 25 may be from about 1000 Å to about 10,000 Å, and accordingly the thickness of dielectric material 22 may be from about 500 Å to about 5000 Å in order to pinch off at the vertex regions.

Dielectric material 22 may comprise any suitable composition or combination of compositions, and in some embodiments may comprise, consist essentially of, or consist of silicon dioxide or phosphorous-doped glass. The dielectric material may be formed by any suitable process, including, for example, atomic layer deposition (ALD) and/or chemical vapor deposition (CVD). For instance, dielectric material 22 may be formed by ALD or CVD from tetraethyl orthosilicate (TEOS).

Referring to FIG. 5, electrically conductive material 15 is deposited within opening 26, and not within voids 28, to form an interconnect 14. In some embodiments the opening 26 may extend entirely through the substrate 12, and the interconnect may be a through-semiconductor interconnect. The conductive material 15 may comprise any suitable composition or combination of compositions, including, for example various compositions discussed above with reference to FIGS. 1 and 2. In some embodiments the conductive material 15 may comprise, consist essentially of, or consist of copper. In some embodiments a first portion of conductive material 15 may be deposited along an interior surface of opening 26 to form an initial layer, and then the remainder of conductive material 15 may be formed along such initial layer to fill opening 26. In such embodiments the initial layer may comprise, for example, tantalum, and the conductive material that fills the remainder of the opening may comprise, consist essentially of, or consist of copper.

The conductive material 15 may be deposited in the shown configuration which fills opening 26 and not voids 28 by providing a mask (not shown) over the voids during the deposition of material 15, or by forming the voids to be too small for direct deposition of conductive material 15 therein.

In some embodiments the dielectric material 22, voids 28 and electrically conductive interconnect 14 may be together considered to be configured as a through-semiconductor interconnect region. In the cross-sectional view of FIG. 5, such interconnect region has a substantially circular interior region corresponding to interconnect 14, has the liner 24 of dielectric material 22 surrounding a lateral periphery of such interior region, and has projections 30 joining to the dielectric material liner. The individual projections have an outer dielectric ring 31 corresponding to dielectric material 22, and have inner dielectric regions 33 corresponding to voids 28. In the shown embodiment such inner dielectric regions are empty (i.e., comprise gaseous material). In other embodiments, other dielectric materials may be formed within the voids at a processing stage subsequent to that of FIG. 5. The dielectric materials formed within the voids may be of a different composition than the dielectric material 22.

Example dielectric materials that may be formed within the voids are silicon oxide, doped silicon oxide (for instance, borophosphosilicate glass, phosphosilicate glass, fluorosilicate glass, etc.) silicon nitride, high k dielectric materials, low k dielectric materials, etc. The dielectric materials formed within the voids may be solid or substantially solid, as opposed to the gaseous material present within the voids at the processing stage of FIG. 5, in some embodiments.

The substantially circular shape of the interior region corresponding to interconnect 14 is one example of a closed shape of such interior region. In other embodiments the interior region may have another suitable closed shape such as, for example, a substantially elliptical shape, a substantially oval-shape, a polygonal shape, etc.

The shown embodiment has eight of the projections 30 extending around the lateral periphery of liner 24. In other embodiments there may be other numbers of projections extending around such lateral periphery. The projections provide electrically insulative isolation adjacent conductive interconnect 14, and thus there are preferably at least two projections along liner 24. The number of projections, and the locations of the projections, may be tailored in order to achieve desired electrical isolation of interconnect 14; as well as to alleviate stresses and/or to impart directed stresses within semiconductor material 12. In some embodiments there may be 2, 3, 4, 5, 6, 7, 8, 9, etc., projections provided along the outer periphery of liner 24.

Figure 6:
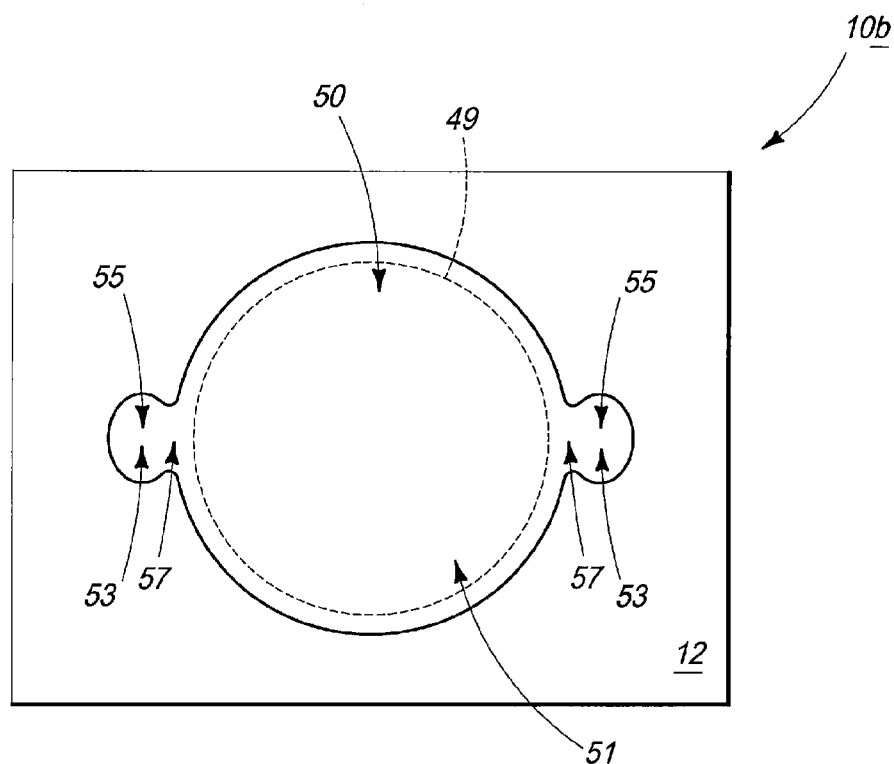
FIGS. 6-8 are top cross-sectional views of a semiconductor construction at various stages of another example embodiment process for forming an interconnect region.
Figure 7:
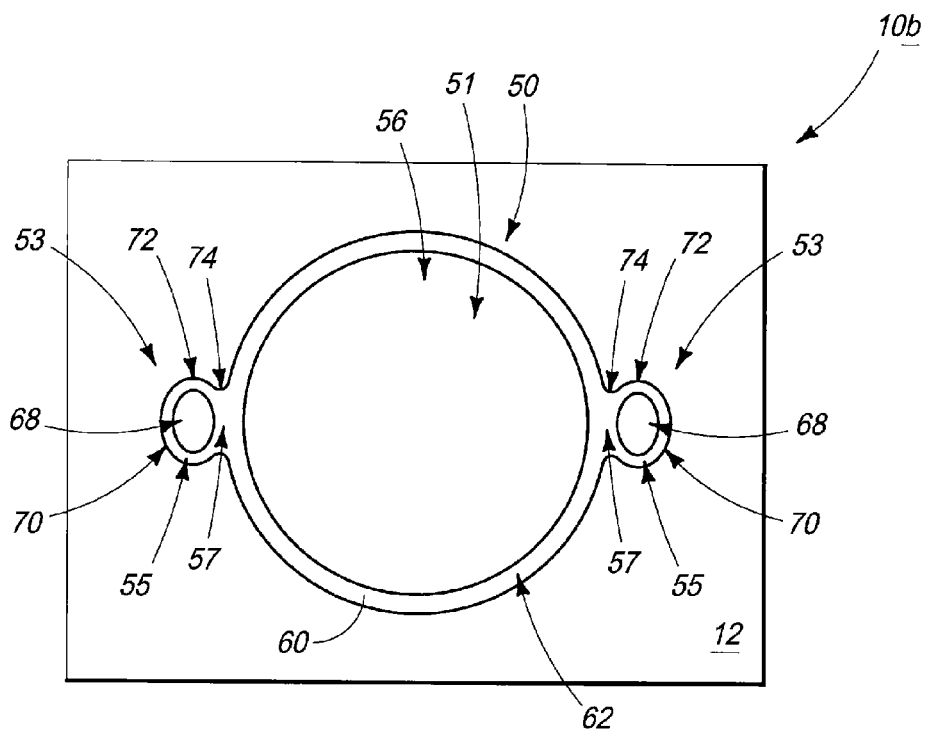
Figure 8:
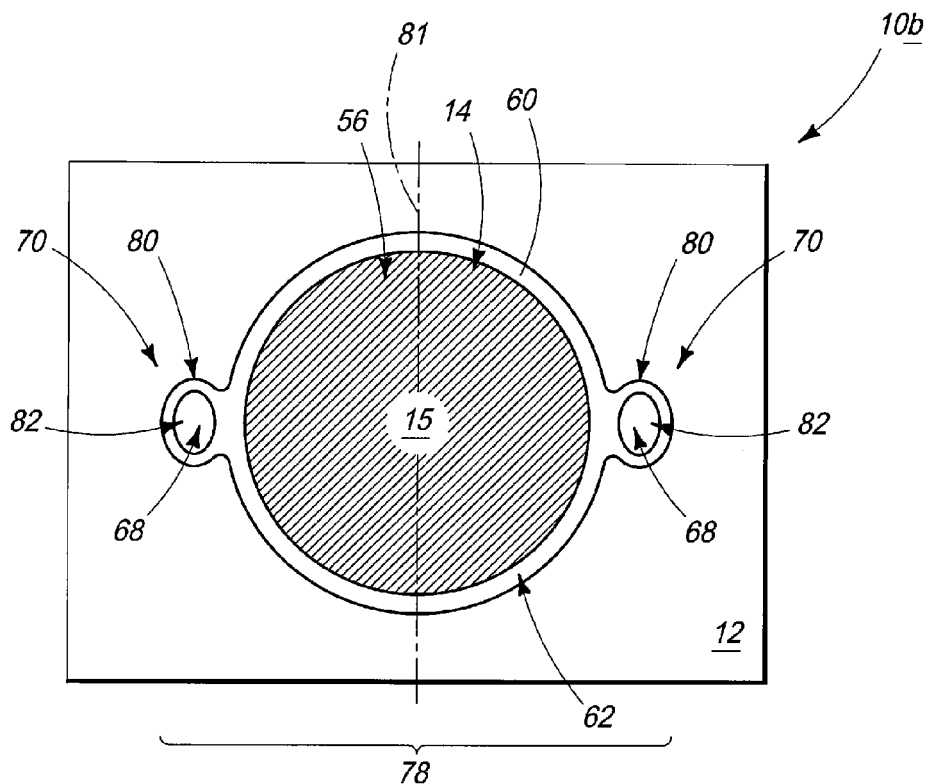

The embodiment of FIG. 5 comprises projections 30 that are triangular-shaped. Other shapes of projections may be utilized in other embodiments. FIGS. 6-8 illustrate a process that may be utilized for forming another shape of projections.

Referring to FIG. 6, a semiconductor die construction 10b is shown to comprise the semiconductor material substrate 12, and to comprise an opening 50 extending through, or partially through, the substrate. Opening 50 may be formed with any suitable processing including, for example, a Bosch-type process.

Opening 50 comprises a substantially circular primary region 51, and a plurality of chambers 53 around the primary region. A dashed line 49 is provided to diagrammatically demarcate a periphery of the substantially circular primary region 51.

The chambers 53 are shaped as bulbous regions 55 joining to stem regions 57. Each of the chambers may be considered to join with the primary region 51 of opening 50 at a base of a stem region 57.

In the shown embodiment there are two chambers 53, with such chambers being on opposing sides of the primary region 51 along the cross section of the FIG. 6 view. In other embodiments there may be more than two chambers.

Referring to FIG. 7, dielectric material 60 is provided along sidewall edges of opening 50. The dielectric material 60 may be identical to the material 22 discussed above with reference to FIGS. 3-5. Dielectric material 60 is provided to a thickness such that the material pinches off stem regions 57. Accordingly, a dielectric liner 62 of material 60 is formed along the periphery of primary region 51. The liner defines an opening 56 within the primary region 51, with such opening having the substantially circular shape of the primary region 51. The dielectric material 60 also laterally surrounds peripheries within the individual chambers 53 to form projections 70 having voids 68 therein. In some embodiments the widths of the stem regions 57 may be from about 1000 Å to about 10,000 Å, and accordingly the thickness of dielectric material 60 may be from about 500 Å to about 5000 Å in order to pinch off at the stem regions.

The projections 70 have a shape of bulbous regions 72 joining to stem regions 74, complementary to an interior of chambers 53.

Referring to FIG. 8, electrically conductive material 15 is deposited within opening 56, and not within voids 68, to form the interconnect 14; and in some embodiments such interconnect may be a through-semiconductor interconnect. The conductive material 15 may comprise, for example, any of the various compositions discussed above with reference to FIGS. 1, 2 and 5.

The conductive material 15 may be deposited in the shown configuration which fills opening 56 and not voids 68 by providing a mask (not shown) over the voids during the deposition of material 15, or by forming the voids to be too small for direct deposition of conductive material 15 therein.

In some embodiments the dielectric material 62, voids 68 and interconnect 14 may be together considered to be configured as a through-semiconductor interconnect region 78. In the cross-sectional view of FIG. 8, such interconnect region has a substantially circular interior region corresponding to interconnect 14, has the liner 62 of dielectric material 60 surrounding a lateral periphery of such interior region, and has projections 70 joining to the dielectric material liner. The individual projections have an outer dielectric ring 80 corresponding to dielectric material 60, and have inner dielectric regions 82 corresponding to voids 68. In the shown embodiment such inner dielectric regions are empty (i.e., comprise gaseous material). In other embodiments, other dielectric materials may be formed within the voids at a processing stage subsequent to that of FIG. 8. The dielectric materials formed within the voids may be of a different composition than the dielectric material 60. Example dielectric materials that may be formed within the voids are silicon oxide, doped silicon oxide (for instance, borophosphosilicate glass, phosphosilicate glass, fluorosilicate glass, etc.) silicon nitride, high k dielectric materials, low k dielectric materials, etc. The dielectric materials formed within the voids may be solid or substantially solid, as opposed to the gaseous material present within the voids at the processing stage of FIG. 8, in some embodiments.

Figure 9:
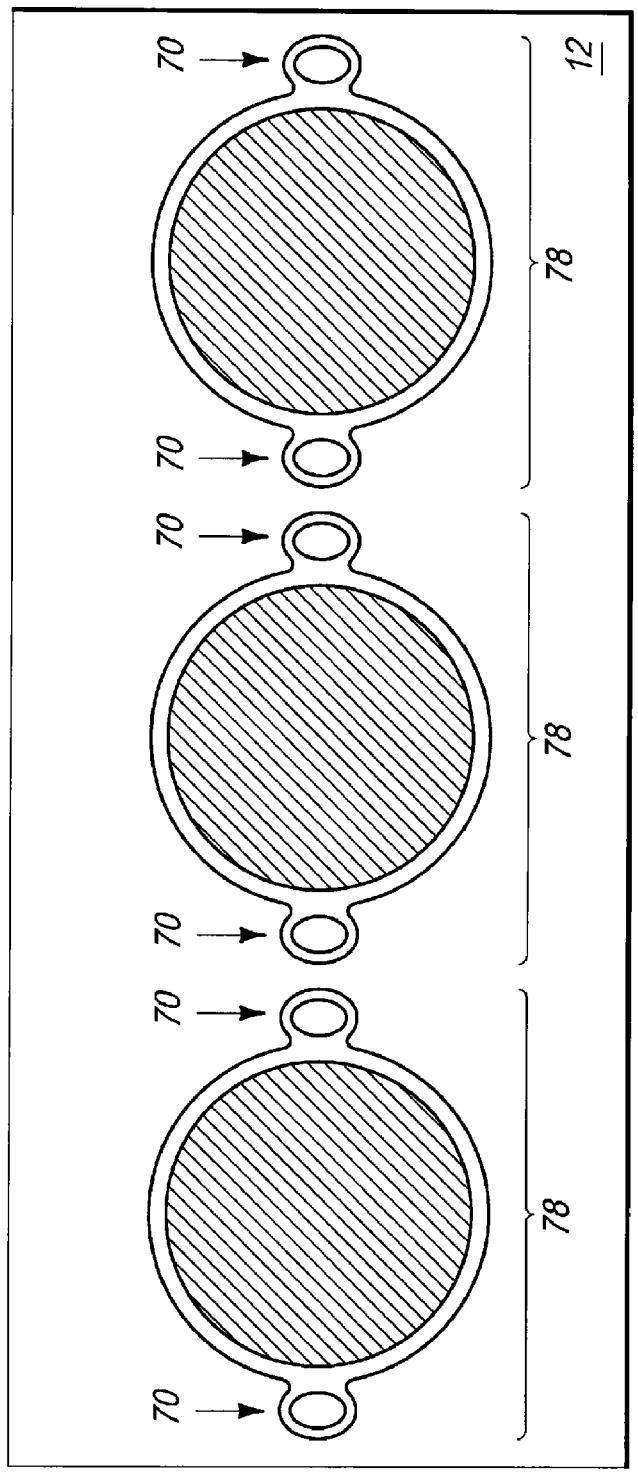
FIG. 9 is a top cross-sectional view of a semiconductor construction illustrating an example arrangement of interconnect regions.

In the shown embodiment there are two dielectric projections 70, with such projections being on opposing sides of the interconnect 14 along the cross section of the FIG. 8 view. The projections 70 are mirror images of one another along a plane 81 that extends through interconnect 14 along a direction orthogonal to the cross-section of FIG. 8. The illustrated configuration may be particularly advantageous for providing electrical isolation along a row of interconnect regions, as shown in FIG. 9. Specifically, FIG. 9 shows a construction 10c in which a row of interconnect regions 78 is formed within semiconductor material 12. The dielectric projections 70 of adjacent interconnect regions are pointed toward one another, and thus provide substantial dielectric spacing between neighboring interconnect regions.

The embodiment of FIG. 9 is an example embodiment for providing projections 70 in locations beneficial for providing dielectric spacing between adjacent interconnect regions. In other embodiments there may be other arrangements of the projections. For instance, in some embodiments there may be an array of interconnects arranged in rows and columns. In such embodiments, each interconnect region may comprise four or more projections to provide dielectric spacing along the various directions in which there will be neighboring interconnects.

Figure 10:
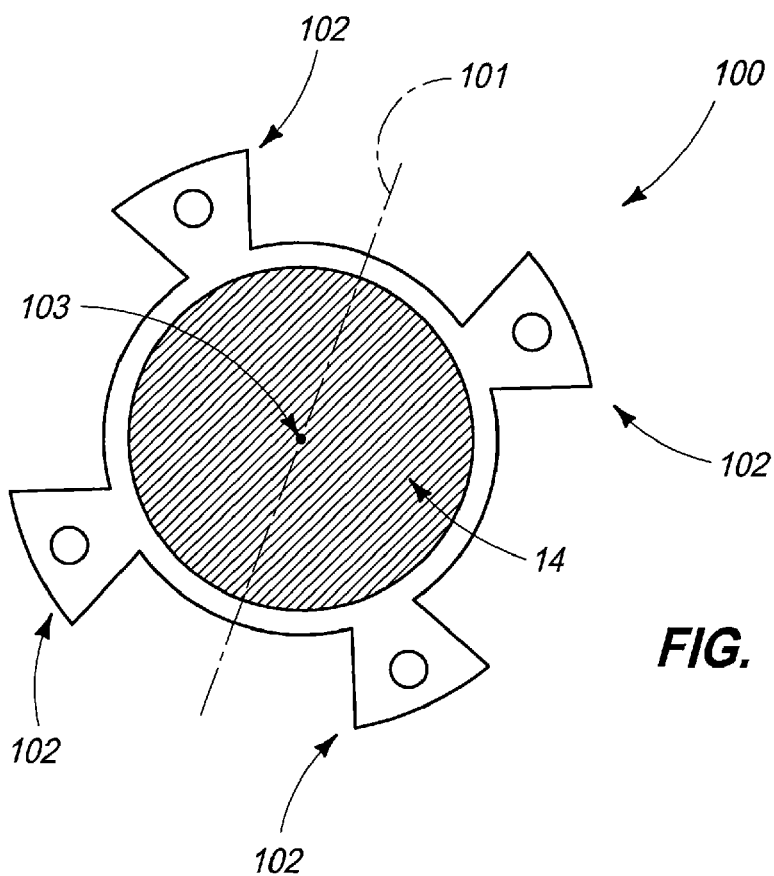
FIG. 10 is a top cross-sectional view of a semiconductor construction illustrating an example interconnect region.
Figure 11:
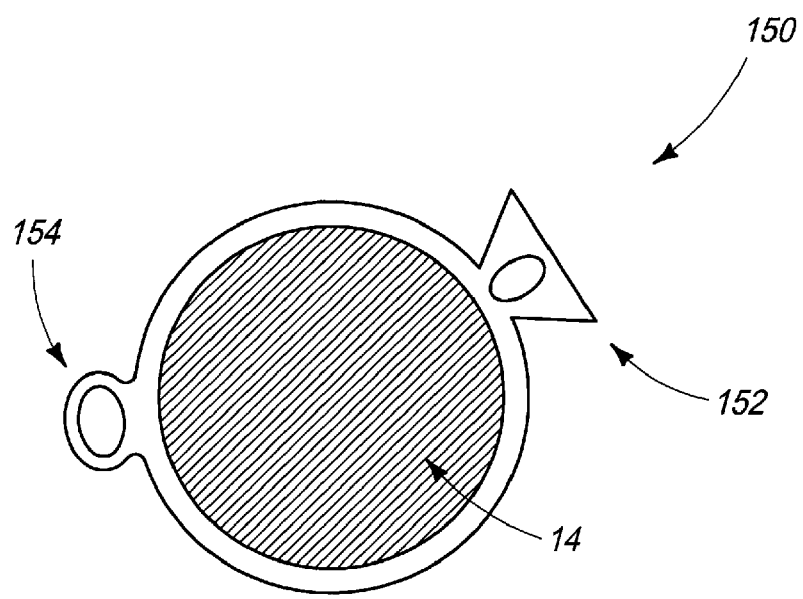
FIG. 11 is a top cross-sectional view of a semiconductor construction illustrating another example interconnect region.

The projections of the interconnect regions of FIGS. 5 and 8 can provide dielectric properties for the interconnect regions, and/or can be utilized to alter stresses in semiconductor material 12 (the alteration of the stresses may comprise alleviating stresses in some embodiments, and may comprise tailoring stresses by inducing stresses along predefined directions in other embodiments). Some applications may have preferred symmetries of the configuration of the projections, and other applications may have preferred asymmetries of the configuration of the projections. FIGS. 10 and 11 show configurations of interconnect regions which have symmetry (FIG. 10) and asymmetry (FIG. 11).

Referring to FIG. 10, an interconnect region 100 comprises an interconnect 14 that is substantially circular in shape. A plurality of projections 102 are arranged around the interconnect such that the interconnect region has mirror symmetry along a plane 101 extending through a center of the interconnect in a directional orthogonal to the cross-section of FIG. 10, and has rotational symmetry about an axis 103 extending through the center of the interconnect in the directional orthogonal to the cross-section of FIG. 10.

Referring to FIG. 11, an interconnect region 150 comprises an interconnect 14 that is substantially circular in shape. Projections 152 and 154 are arranged around the interconnect such that the interconnect region is asymmetrical. In the shown embodiment the projections are structurally different one another (specifically, projection 152 is triangular shaped, and projection 154 is bulbous shaped), which contributes to the asymmetry. It is noted that the interconnect 14 has symmetry (specifically, since the interconnect is substantially circular, it has substantially has rotational symmetry and mirror symmetry relative to a plane and axis analogous to the plane 101 and axis 103 of FIG. 10). However, the projections 152 and 154 are asymmetrically disposed relative to such interconnect and thus cause the interconnect region to be asymmetric.

The embodiments discussed above may be utilized in semiconductor die packages that are ultimately incorporated into electronic systems. The electronic systems may be any suitable systems, with example systems being computers, cars, airplanes, clocks, cellular phones, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An interconnect region, comprising along a cross-section:
   a closed-shape interior region having an electrically conductive material therein;
   a first dielectric material configured as a liner extending entirely around a lateral periphery of the interior region; and
   at least two dielectric projections joining to the dielectric material liner and being laterally outward of the interior region; the dielectric projections having an outer dielectric ring surrounding an inner dielectric region; the outer dielectric ring consisting of the first dielectric material and the inner dielectric region comprising a composition different from a composition of the first dielectric material.

2. The interconnect region of claim 1 wherein the inner dielectric region composition is gaseous.

3. The interconnect region of claim 1 wherein the inner dielectric region composition is solid.

4. The interconnect region of claim 1 wherein the closed shape and projections together form a structure substantially having mirror symmetry across a plane extending along a direction orthogonal to the cross-section and through a center of said structure.

5. The interconnect region of claim 1 wherein the closed shape substantially has mirror symmetry across a plane extending through a center of the closed shape along a direction orthogonal to the cross-section; and wherein the projections are in an arrangement that does not have said minor symmetry.

6. The interconnect region of claim 1 wherein the closed shape and projections together form a structure substantially having rotational symmetry along an axis extending along a direction orthogonal to the cross-section and through a center of the structure.

7. The interconnect region of claim 1 wherein the closed shape substantially has rotational symmetry along an axis extending through a center of the closed shape along a direction orthogonal to the cross-section; and wherein the projections are in an arrangement that does not have said rotational symmetry.

8. The interconnect region of claim 1 wherein the first dielectric material liner has a thickness of less than or equal to about 5000 Å.

9. The interconnect region of claim 1 wherein the closed shape is substantially circular.

10. The interconnect region of claim 1 wherein the projections are substantially triangular-shaped.

11. The interconnect region of claim 1 wherein individual projections comprise a bulbous region and a stem region, with the stem region joining directly to the liner.

12. The interconnect region of claim 1 wherein the at least two dielectric projections are exactly two projections that are on opposing sides of the closed shape region from one another, and that are substantially minor images of one another.

13. An interconnect region, comprising along a cross-section:
   a substantially circular interior region having a copper-containing interconnect therein;
   a first dielectric material configured as a liner extending entirely around a lateral periphery of the interconnect; and
   at least two substantially triangular-shaped dielectric projections joining to the dielectric material liner and being laterally outward of the interior region; the dielectric projections having an outer dielectric ring surrounding an inner dielectric region; the outer dielectric ring consisting of the first dielectric material and the inner dielectric region comprising a composition different from a composition of the first dielectric material.

14. The interconnect region of claim 13 comprising at least four of said projections.

15. The interconnect region of claim 13 comprising at least six of said projections.

16. The interconnect region of claim 13 comprising at least eight of said projections.

17. The interconnect region of claim 13 wherein the substantially circular interior region and projections together form a structure having substantially mirror symmetry across a plane extending along a direction orthogonal to the cross-section and through a center of the structure.

18. The interconnect region of claim 13 wherein the substantially circular interior region substantially has mirror symmetry across a plane extending through a center of the substantially circular interior region along a direction orthogonal to the cross-section; and wherein the triangular-shaped projections are in an arrangement that does not have said minor symmetry.

19. The interconnect region of claim 13 wherein the substantially circular interior region and projections together form a structure substantially having rotational symmetry along an axis extending along a direction orthogonal to the cross-section and through a center of the structure.

20. The interconnect region of claim 13 wherein the substantially circular interior region substantially has rotational symmetry along an axis extending through a center of the substantially circular interior region along a direction orthogonal to the cross-section; and wherein the triangular-shaped projections are in an arrangement that does not have said rotational symmetry.

21. The interconnect region of claim 13 wherein the inner dielectric region composition is gaseous.

22. The interconnect region of claim 13 wherein the inner dielectric region composition is solid.

* * * * *

UNITED STATES PATENT AND TRADEMARK OFFICE
CERTIFICATE OF CORRECTION

PATENT NO. : 8,283,785 B2  
APPLICATION NO. : 12/886199  
DATED : October 9, 2012  
INVENTOR(S) : Kyle K. Kirby et al.

Page 1 of 1

It is certified that error appears in the above-identified patent and that said Letters Patent is hereby corrected as shown below:

On the cover page, item (74), in "Attorney, Agent, or Firm", in column 2, line 1, delete "Walls" and insert -- Wells --, therefor.

In column 7, line 34, in Claim 5, delete "minor" and insert -- mirror --, therefor.

In column 8, line 4, in Claim 12, delete "minor" and insert -- mirror --, therefor.

In column 8, line 38, in Claim 18, delete "minor" and insert -- mirror --, therefor.

Signed and Sealed this  
Eighteenth Day of December, 2012

David J. Kappos  
*Director of the United States Patent and Trademark Office*